United States Patent
Song

(10) Patent No.: US 9,570,136 B2
(45) Date of Patent: Feb. 14, 2017

(54) SEMICONDUCTOR MEMORY APPARATUS

(71) Applicant: SK hynix Inc., Icheon-si Gyeonggi-do (KR)

(72) Inventor: Choung Ki Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 28 days.

(21) Appl. No.: 14/668,379

(22) Filed: Mar. 25, 2015

(65) Prior Publication Data

US 2016/0163367 A1 Jun. 9, 2016

(30) Foreign Application Priority Data

Dec. 5, 2014 (KR) .................. 10-2014-0174465

(51) Int. Cl.
*G11C 7/00* (2006.01)
*G11C 8/18* (2006.01)
*G11C 8/10* (2006.01)

(52) U.S. Cl.
CPC .. *G11C 8/18* (2013.01); *G11C 8/10* (2013.01)

(58) Field of Classification Search
CPC ............ G11C 8/10; G11C 8/18; G11C 7/1078
USPC .......................... 365/189.14, 189.16, 230.06
See application file for complete search history.

(56) References Cited

U.S. PATENT DOCUMENTS 8,355,270 B2 * 1/2013 Nakaoka ............. G11C 7/1069
  365/189.05
2014/0177343 A1 * 6/2014 Chan .................... G11C 7/1012
  365/189.02

FOREIGN PATENT DOCUMENTS

KR      1020120075322 A      7/2012

* cited by examiner

*Primary Examiner* — Son Dinh
(74) *Attorney, Agent, or Firm* — William Park & Associates Ltd.

(57) ABSTRACT

A semiconductor memory apparatus may include a decoding control block configured to generate a first decoding control signal and a second decoding control signal in response to a double enable signal and a first address. The semiconductor memory apparatus may include a decoding block configured to enable only one word line among a plurality of word lines or may simultaneously enable at least two word lines among the plurality of word lines, in response to the first and second decoding control signals and a second address.

21 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean application number 10-2014-0174465, filed on Dec. 5, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to receive and store data. The semiconductor memory apparatus may output stored data. The semiconductor memory apparatus receives an address to designate a position where data is to be stored. The semiconductor memory apparatus receives an address to designate a position where data is to be outputted from.

When the semiconductor memory apparatus designates the storage position or the output position of data, a row-related address and a column-related address are used. In general, a row-related address is an address for selecting a word line, and a column-related address is an address for selecting a bit line.

The semiconductor memory apparatus performs an operation of selecting a word line or a bit line by decoding the address received from a device exterior to the semiconductor memory apparatus.

SUMMARY

In an embodiment, a semiconductor memory apparatus may include a decoding control block configured to generate a first decoding control signal and a second decoding control signal in response to a double enable signal and a first address. The semiconductor memory apparatus may include a decoding block configured to enable only one word line among a plurality of word lines or may simultaneously enable at least two word lines among the plurality of word lines, in response to the first and second decoding control signals and a second address.

In an embodiment, a semiconductor memory apparatus may include a decoding control block configured to generate a first decoding control signal and a second decoding control signal in response to a specified address among a plurality of addresses and a double enable signal. The semiconductor memory apparatus may include a first decoding block configured to enable one word line or simultaneously enable two word lines among a plurality of first word lines, in response to addresses remaining by excluding the specified address among the plurality of addresses and the first and second decoding control signals. The semiconductor memory apparatus may include a second decoding block configured to enable one word line or may simultaneously enable two word lines among a plurality of second word lines, in response to the addresses remaining by excluding the specified address among the plurality of addresses and the first and second decoding control signals.

In an embodiment, a semiconductor memory apparatus may include a first decoding control block configured to generate a first decoding control signal and a second decoding control signal in response to a specified address among a plurality of addresses and a double enable signal. The semiconductor memory apparatus may include a second decoding control block configured to generate a third decoding control signal and a fourth decoding control signal in response to the specified address, the double enable signal and a double control signal. The semiconductor memory apparatus may include a first decoding block configured to enable one word line or simultaneously enable two word lines among a plurality of first word lines, in response to addresses remaining by excluding the specified address among the plurality of addresses and the first and second decoding control signals. The semiconductor memory apparatus may include a second decoding block configured to enable one word line or may simultaneously enable two word lines among a plurality of second word lines, in response to the addresses remaining by excluding the specified address among the plurality of addresses and the third and fourth decoding control signals.

In an embodiment, a semiconductor memory apparatus may include a first data storage region electrically coupled with a plurality of first word lines. The semiconductor memory apparatus may include a second data storage region electrically coupled with a plurality of second word lines. In response to a double enable signal, a double control signal and a plurality of addresses, two word lines among the plurality of first word lines may be simultaneously enabled and one word line among the plurality of second word lines is enabled, or two word lines among the plurality of first word lines are simultaneously enabled and two word lines among the plurality of second word lines may be simultaneously enabled.

DETAILED DESCRIPTION

Hereinafter, a semiconductor memory apparatus will be described below with reference to the accompanying drawings through various examples of embodiments.

Figure 1:
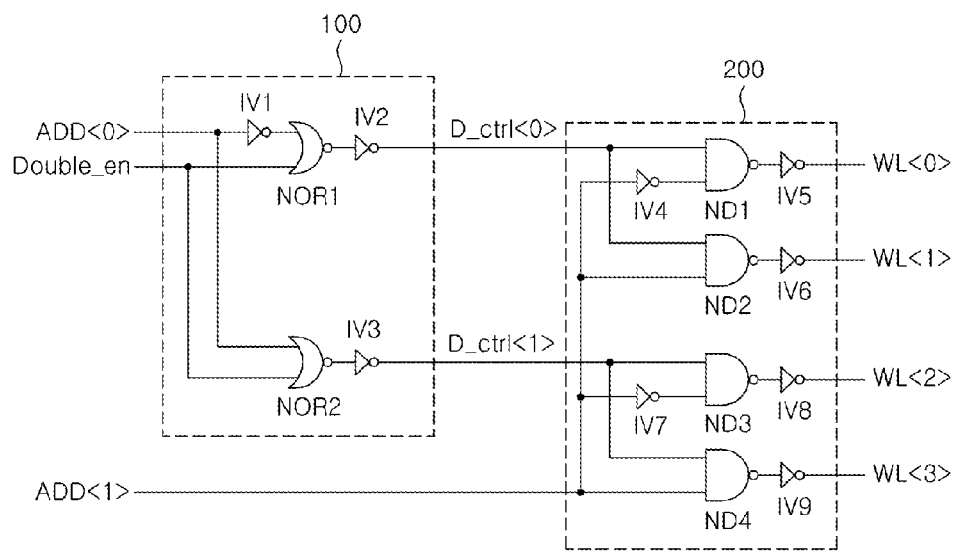
FIG. 1 is a configuration diagram illustrating a representation of an example of a semiconductor memory apparatus in accordance with an embodiment.

Referring to FIG. 1, a semiconductor memory apparatus in accordance with an embodiment may include a decoding control block 100 and a decoding block 200.

The decoding control block 100 generates a first decoding control signal D_ctrl<0> and a second decoding control signal D_ctrl<1>. The decoding control block 100 generates a first control signal D_ctrl<0> and a second decoding control signal D_ctrl<1> in response to a double enable signal Double_en and a first address ADD<0>. For example, the decoding control block 100 outputs the first and second decoding control signals D_ctrl<0> and D_ctrl<1> as signals with different levels in response to the first address ADD<0>, when the double enable signal Double_en is disabled (i.e., at a predetermined level). The decoding control block 100 outputs the first and second decoding control signals D_ctrl<0> and D_ctrl<1> as signals with the same level regardless of the first address ADD<0>, when the double enable signal Double_en is, for example, enabled (i.e., at a predetermined level). For example, the decoding control block 100 outputs the first decoding control signal D_ctrl<0> with a low level and outputs the second decoding control signal D_ctrl<1> with a high level, when the double enable signal Double_en is disabled and the first address ADD<0> is a high level. For example, the decoding control block 100 outputs the first decoding control signal D_ctrl<0> with a high level and outputs the second decoding control signal D_ctrl<1> with a low level, when the double enable signal Double_en is disabled and the first address ADD<0> is a low level. For example, the decoding control block 100 outputs the first and second decoding control signals D_ctrl<0> and D_ctrl<1> with the high level regardless of the first address ADD<0> when the double enable signal Double_en is enabled. The double enable signal Double_en may be a signal outputted from a register for setting the operations of a semiconductor memory apparatus, for example, a mode register set.

The decoding control block 100 may include first to third inverters IV1, IV2 and IV3. The decoding control block 100 may include first and second NOR gates NOR1 and NOR2. The first inverter IV1 receives the first address ADD<0>. The first NOR gate NOR1 receives the output signal of the first inverter IV1 and the double enable signal Double_en. The second inverter IV2 receives the output signal of the first NOR gate NOR1. The second inverter IV2 outputs the first decoding control signal D_ctrl<0>. The second NOR gate NOR2 receives the first address ADD<0> and the double enable signal Double_en. The third inverter IV3 receives the output signal of the second NOR gate NOR2. The third inverter IV3 outputs the second decoding control signal D_ctrl<1>.

The decoding block 200 enables only one word line or simultaneously enables two word lines among first to fourth word lines WL<0>, WL<1>, WL<2> and WL<3>. The decoding block 200 enables only one word line or simultaneously enables two word lines among first to fourth word lines WL<0>, WL<1>, WL<2> and WL<3> in response to the first and second decoding control signals D_ctrl<0> and D_ctrl<1> and a second address ADD<1>. For example, the decoding block 200 enables one word line among the first to fourth word lines WL<0>, WL<1>, WL<2> and WL<3> in response to the second address ADD<1> when the first and second decoding control signals D_ctrl<0> and D_ctrl<1> with different levels are inputted. For example, the decoding block 200 simultaneously enables two word lines among the first to fourth word lines WL<0>, WL<1>, WL<2> and WL<3> in response to the second address ADD<1> when the first and second decoding control signals D_ctrl<0> and D_ctrl<1> with the same level are inputted. For example, the decoding block 200 enables one word line between the first word line WL<0> and the second word line WL<1> in response to the second address ADD<1> when the first decoding control signal D_ctrl<0> is at the high level and the second decoding control signal D_ctrl<1> is at the low level. The decoding block 200 enables one word line between the third word line WL<2> and the fourth word line WL<3> in response to the second address ADD<1> when the first decoding control signal D_ctrl<0> is at the low level and the second decoding control signal D_ctrl<1> is at the high level. The decoding block 200 simultaneously enables the first and third word lines WL<0> and WL<2> when both the first and second decoding control signals D_ctrl<0> and D_ctrl<1> are the same, as the high level, and the second address ADD<1> is a low level. The decoding block 200 simultaneously enables the second and fourth word lines WL<1> and WL<3> when both the first and second decoding control signals D_ctrl<0> and D_ctrl<1> are the same, as the high level, and the second address ADD<1> is a high level.

The decoding block 200 may include fourth to ninth inverters IV4, IV5, IV6, IV7, IV8 and IV9. The decoding block 200 may include first to fourth NAND gates ND1, ND2, ND3 and ND4. The fourth inverter IV4 receives the second address ADD<1>. The first NAND gate ND1 receives the first decoding control signal D_ctrl<0>. The first NAND gate ND1 receives the output signal of the fourth inverter IV4. The fifth inverter IV5 receives the output signal of the first NAND gate ND1, and may enable the first word line WL<0>. The second NAND gate ND2 receives the first decoding control signal D_ctrl<0> and the second address ADD<1>. The sixth inverter IV6 receives the output signal of the second NAND gate ND2, and may enable the second word line WL<1>. The seventh inverter IV7 receives the second address ADD<1>. The third NAND gate ND3 receives the second decoding control signal D_ctrl<1> and the output signal of the seventh inverter IV7. The eighth inverter IV8 receives the output signal of the third NAND gate ND3, and may enable the third word line WL<2>. The fourth NAND gate ND4 receives the second decoding control signal D_ctrl<1> and the second address ADD<1>. The ninth inverter IV9 receives the output signal of the fourth NAND gate ND4, and may enable the fourth word line WL<3>.

While the semiconductor memory apparatus in accordance with an embodiment discloses a configuration in which four word lines are enabled by using two addresses, this represents an example and it is to be noted that the numbers of addresses and word lines are not limited specifically. While it is described as an example that two word lines are simultaneously enabled, it is to be noted that the number of word lines to be simultaneously enabled is not limited to two.

Operations of the semiconductor memory apparatus in accordance with an embodiment, configured as mentioned above, will be described below.

Descriptions will be made for operations in which the double enable signal Double_en is disabled and one word line among the first to fourth word lines WL<0>, WL<1>, WL<2> and WL<3> is enabled.

The decoding control block 100 generates the first and second decoding control signals D_ctrl<0> and D_ctrl<1> with different levels in response to the first address ADD<0> when the double enable signal Double_en is disabled. For example, the decoding control block 100 outputs the first decoding control signal D_ctrl<0> at a high level and outputs the second decoding control signal D_ctrl<1> at a low level, when the double enable signal Double_en is disabled to a low level and the first address ADD<0> is at the low level. For example, the decoding control block 100 outputs the first decoding control signal D_ctrl<0> at a low level and outputs the second decoding control signal D_ctrl<1> at a high level, when the double enable signal Double_en is disabled to the low level and the first address ADD<0> is at the high level.

The decoding block 200 enables one of the first to fourth word lines WL<0>, WL<1>, WL<2> and WL<3> in response to the second address ADD<1>, when the first and second decoding control signals D_ctrl<0> and D_ctrl<1> have different levels. For example, the decoding block 200 enables the first word line WL<0> among the first to fourth word lines WL<0>, WL<1>, WL<2> and WL<3> when the second address ADD<1> is at the low level in the example where the first decoding control signal D_ctrl<0> is at the high level and the second decoding control signal D_ctrl<1> is at the low level. The decoding block 200 enables the second word line WL<1> among the first to fourth word lines WL<0>, WL<1>, WL<2> and WL<3> when the second address ADD<1> is at the high level in the example where the first decoding control signal D_ctrl<0> is at the high level and the second decoding control signal D_ctrl<1> is at the low level. The decoding block 200 enables the third word line WL<2> among the first to fourth word lines WL<0>, WL<1>, WL<2> and WL<3> when the second address ADD<1> is at the low level in the example where the first decoding control signal D_ctrl<0> is at the low level and the second decoding control signal D_ctrl<1> is at the high level. The decoding block 200 enables the fourth word line WL<3> among the first to fourth word lines WL<0>, WL<1>, WL<2> and WL<3> when the second address ADD<1> is at the high level in the example where the first decoding control signal D_ctrl<0> is at the low level and the second decoding control signal D_ctrl<1> is at the high level.

As a result, the semiconductor memory apparatus in accordance with an embodiment may perform the operation of enabling one word line among a plurality of word lines when the double enable signal Double_en is disabled.

Descriptions will be made for operations in which the double enable signal Double_en is enabled and two word lines among the first to fourth word lines WL<0>, WL<1>, WL<2> and WL<3> are simultaneously enabled.

The decoding control block 100 outputs the first and second decoding control signals D_ctrl<0> and D_ctrl<1> as signals with the same level when the double enable signal Double_en is enabled. For example, the decoding control block 100 outputs both the first and second decoding control signals D_ctrl<0> and D_ctrl<1> as signals with the high level regardless of the first address ADD<0>, when the double enable signal Double_en is enabled to a high level.

The decoding block 200 simultaneously enables two word lines among the first to fourth word lines WL<0>, WL<1>, WL<2> and WL<3> in response to the second address ADD<1> when the first and second decoding control signals D_ctrl<0> and D_ctrl<1> with the same level are inputted. For example, the decoding block 200 simultaneously enables the first and third word lines WL<0> and WL<2> among the first to fourth word lines WL<0>, WL<1>, WL<2> and WL<3> when the first and second decoding control signals D_ctrl<0> and D_ctrl<1> with the high level are inputted and the second address ADD<1> is at the low level. The decoding block 200 simultaneously enables the second and fourth word lines WL<1> and WL<3> among the first to fourth word lines WL<0>, WL<1>, WL<2> and WL<3> when the first and second decoding control signals D_ctrl<0> and D_ctrl<1> with the high level are inputted and the second address ADD<1> is at the high level.

As a result, the semiconductor memory apparatus in accordance with an embodiment simultaneously enables two word lines among a plurality of word lines when the double enable signal Double_en is enabled.

Figure 4:
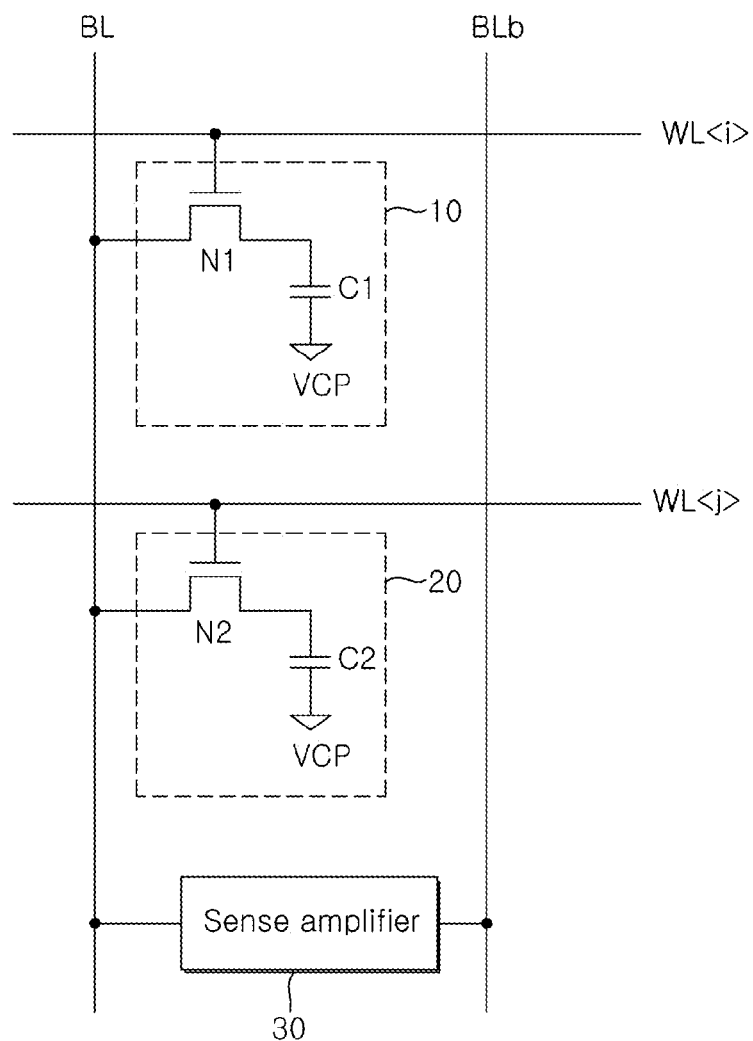
FIG. 4 is a representation of an example of a configuration diagram to assist in the explanation of the semiconductor memory apparatus in accordance with the various embodiments.

Operations of the semiconductor memory apparatus in accordance with the embodiments will be described below with reference to FIG. 4.

If the double enable signal Double_en is disabled, one word line WL<i> among a plurality of word lines WL<i> and WL<j> is enabled in response to an address, and when one bit line BL is selected, the data stored in a first memory cell 10 is sensed and amplified through a sense amplifier 30.

That is to say, if the double enable signal Double_en is disabled and one word line and one bit line are selected, one memory cell is selected, and data is stored in the selected memory cell or the data stored in the selected memory cell is outputted.

If the double enable signal Double_en is enabled, two word lines WL<i> and WL<j> among the plurality of word lines WL<i> and WL<j> are simultaneously enabled in response to an address, and when one bit line BL is selected, the data stored in first and second memory cells 10 and 20 are sensed and amplified through the sense amplifier 30.

That is to say, if the double enable signal Double_en is enabled, two word lines are simultaneously selected and one bit line is selected, two memory cells are simultaneously selected. The same data are stored in the two memory cells which are simultaneously selected, and the same data are outputted from the two memory cells in which the same data are stored.

As a consequence, when the semiconductor memory apparatus in accordance with an embodiment is used for the high reliability of data, a double enable signal is enabled, and the same data are simultaneously stored in a plurality of memory cells, whereby the reliability of data may be improved. Moreover, when the semiconductor memory apparatus in accordance with an embodiment is used for large data storage capacity, the double enable signal is disabled, data are stored in individual memory cells, whereby large data storage capacity may be secured.

Figure 2:
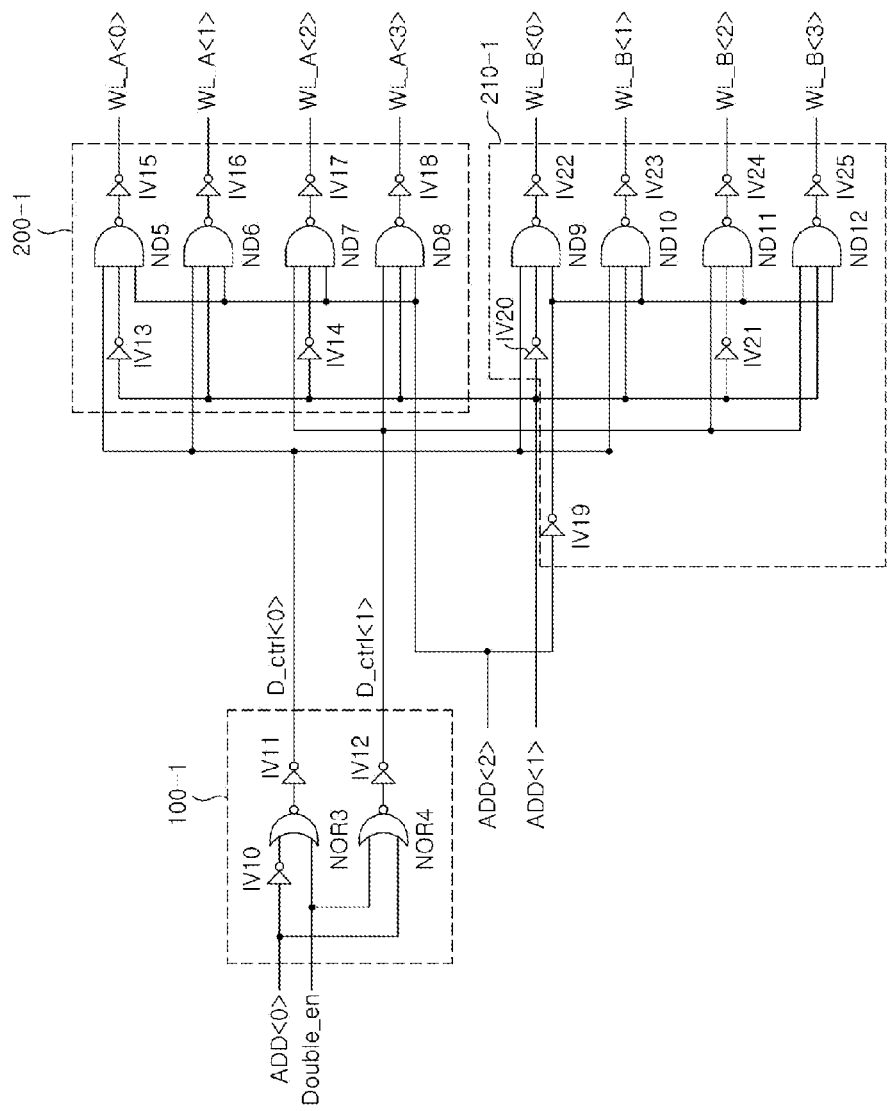
FIG. 2 is a configuration diagram illustrating a representation of an example of a semiconductor memory apparatus in accordance with an embodiment.

Referring to FIG. 2, a semiconductor memory apparatus in accordance with an embodiment may include a decoding control block 100-1, and first and second decoding blocks 200-1 and 210-1.

The decoding control block 100-1 generates first and second decoding control signals D_ctrl<0> and D_ctrl<1>. The decoding control block 100-1 generates first and second decoding control signals D_ctrl<0> and D_ctrl<1> in response to an address specified among first to third addresses ADD<0>, ADD<1> and ADD<2>, for example, the first address ADD<0>, and a double enable signal Double_en. For example, the decoding control block 100-1 outputs the first and second decoding control signals D_ctrl<0> and D_ctrl<1> as signals with different levels in response to the first address ADD<0> when the double enable signal Double_en is disabled. The decoding control block 100-1 outputs the first and second decoding control signals D_ctrl<0> and D_ctrl<1> as signals with the same level regardless of the first address ADD<0> when the double enable signal Double_en is enabled. For example, the decoding control block 100-1 outputs the first decoding control signal D_ctrl<0> with a low level and outputs the second decoding control signal D_ctrl<1> with a high level, when the double enable signal Double_en is disabled and the first address ADD<0> is at a high level. The decoding control block 100-1 outputs the first decoding control signal D_ctrl<0> with a high level and outputs the second decoding control signal D_ctrl<1> with a low level, when the double enable signal Double_en is disabled and the first address ADD<0> is at a low level. The decoding control block 100-1 outputs the first and second decoding control signals D_ctrl<0> and D_ctrl<1> at the high level regardless of the first address ADD<0> when the double enable signal Double_en is enabled. The double enable signal Double_en may be a signal outputted from a register for setting the operations of a semiconductor memory apparatus, for example, a mode register set.

The decoding control block 100-1 may include tenth to twelfth inverters IV10, IV11 and IV12, and third and fourth NOR gates NOR3 and NOR4. The tenth inverter IV10 receives the first address ADD<0>. The third NOR gate NOR3 receives the output signal of the tenth inverter IV10 and the double enable signal Double_en. The eleventh inverter IV11 receives the output signal of the third NOR gate NOR3, and outputs the first decoding control signal D_ctrl<0>. The fourth NOR gate NOR4 receives the first address ADD<0> and the double enable signal Double_en. The twelfth inverter IV12 receives the output signal of the fourth NOR gate NOR4, and outputs the second decoding control signal D_ctrl<1>.

The first decoding block 200-1 may enable one word line or simultaneously enable two word lines among a plurality of first word lines WL_A<0>, WL_A<1>, WL_A<2> and WL_A<3>, for example, four first word lines WL_A<0>, WL_A<1>, WL_A<2> and WL_A<3>, in response to the addresses remaining by excluding the specified address ADD<0> among the first to third addresses ADD<0>, ADD<1> and ADD<2>, for example, the second and third addresses ADD<1> and ADD<2>, and the first and second decoding control signals D_ctrl<0> and D_ctrl<1>. For example, the first decoding block 200-1 enables one word line among the first word lines WL_A<0>, WL_A<1>, WL_A<2> and WL_A<3> in response to the second and third addresses ADD<1> and ADD<2> when the first and second decoding control signals D_ctrl<0> and D_ctrl<1> with different levels are inputted. The first decoding block 200-1 simultaneously enables two word lines among the first word lines WL_A<0>, WL_A<1>, WL_A<2> and WL_A<3> in response to the second and third addresses ADD<1> and ADD<2> when the first and second decoding control signals D_ctrl<0> and D_ctrl<1> with the same level are inputted. For example, the first decoding block 200-1 enables the first-first word line WL_A<0> among the first word lines WL_A<0>, WL_A<1>, WL_A<2> and WL_A<3> when the second address ADD<1> is at a low level in the example where the first decoding control signal D_ctrl<0> with the high level, the second decoding control signal D_ctrl<1> with the low level and the third address ADD<2> with a high level are inputted. The first decoding block 200-1 enables the first-second word line WL_A<1> among the first word lines WL_A<0>, WL_A<1>, WL_A<2> and WL_A<3> when the second address ADD<1> is at a high level in the example where the first decoding control signal D_ctrl<0> with the high level, the second decoding control signal D_ctrl<1> with the low level and the third address ADD<2> with the high level are inputted. The first decoding block 200-1 enables the first-third word line WL_A<2> among the first word lines WL_A<0>, WL_A<1>, WL_A<2> and WL_A<3> when the second address ADD<1> is at the low level in the example where the first decoding control signal D_ctrl<0> with the low level, the second decoding control signal D_ctrl<1> with the high level and the third address ADD<2> with the high level are inputted. The first decoding block 200-1 enables the first-fourth word line WL_A<3> among the first word lines WL_A<0>, WL_A<1>, WL_A<2> and WL_A<3> when the second address ADD<1> is at the high level in the example where the first decoding control signal D_ctrl<0> with the low level, the second decoding control signal D_ctrl<1> with the high level and the third address ADD<2> with the high level are inputted. The first decoding block 200-1 simultaneously enables the first-first word line WL_A<0> and the first-third word line WL_A<2> when the second address ADD<1> is at the low level in the example where the first and second decoding control signals D_ctrl<0> and D_ctrl<1> with the high level are inputted and the third address ADD<2> with the high level is inputted. The first decoding block 200-1 simultaneously enables the first-second word line WL_A<1> and the first-fourth word line WL_A<3> when the second address ADD<1> is at the high level in the example where the first and second decoding control signals D_ctrl<0> and D_ctrl<1> with the high level are inputted and the third address ADD<2> with the high level is inputted.

The first decoding block 200-1 may include thirteenth to eighteenth inverters IV13 to IV18. The first decoding block 200-1 may include fifth to eighth NAND gates ND5 to ND8. The thirteenth inverter IV13 receives the second address ADD<1>. The fourteenth inverter IV14 receives the second address ADD<1>. The fifth NAND gate ND5 receives the first decoding control signal D_ctrl<0>, the output signal of the thirteenth inverter IV13, and the third address ADD<2>. The sixth NAND gate ND6 receives the first decoding control signal D_ctrl<0>, the second address ADD<1>, and the third address ADD<2>. The seventh NAND gate ND7 receives the second decoding control signal D_ctrl<1>, the output signal of the fourteenth inverter IV14, and the third address ADD<2>. The eighth NAND gate ND8 receives the second decoding control signal D_ctrl<1>, the second address ADD<1>, and the third address ADD<2>. The fifteenth inverter IV15 receives the output signal of the fifth NAND gate ND5, and enables the first-first word line WL_A<0>. The sixteenth inverter IV16 receives the output signal of the sixth NAND gate ND6, and enables the first-second word line WL_A<1>. The seventeenth inverter IV17 receives the output signal of the seventh NAND gate ND7, and enables the first-third word line WL_A<2>. The eighteenth inverter IV18 receives the output signal of the eighth NAND gate ND8, and enables the first-fourth word line WL_A<3>.

The second decoding block 210-1 may enable one word line or may simultaneously enable two word lines among a plurality of second word lines WL_B<0>, WL_B<1>, WL_B<2> and WL_B<3>, for example, four second word lines WL_B<0>, WL_B<1>, WL_B<2> and WL_B<3>, in response to the addresses remaining by excluding the specified address ADD<0> among the first to third addresses ADD<0>, ADD<1> and ADD<2> (the second and third addresses ADD<1> and ADD<2>), and the first and second decoding control signals D_ctrl<0> and D_ctrl<1>. For example, the second decoding block 210-1 enables one word line among the second word lines WL_B<0>, WL_B<1>, WL_B<2> and WL_B<3> in response to the second and third addresses ADD<1> and ADD<2> when the first and second decoding control signals D_ctrl<0> and D_ctrl<1> with different levels are inputted. The second decoding block 210-1 simultaneously enables two word lines among the second word lines WL_B<0>, WL_B<1>, WL_B<2> and WL_B<3> in response to the second and third addresses ADD<1> and ADD<2> when the first and second decoding control signals D_ctrl<0> and D_ctrl<1> with the same level are inputted. For example, the second decoding block 210-1 enables the second-first word line WL_B<0> among the second word lines WL_B<0>, WL_B<1>, WL_B<2> and WL_B<3> when the second address ADD<1> is at the low level in the example where the first decoding control signal D_ctrl<0> with the high level, the second decoding control signal D_ctrl<1> with the low level and the third address ADD<2> with a low level are inputted. The second decoding block 210-1 enables the second-second word line WL_B<1> among the second word lines WL_B<0>, WL_B<1>, WL_B<2> and WL_B<3> when the second address ADD<1> is at the high level in the example where the first decoding control signal D_ctrl<0> with the high level, the second decoding control signal D_ctrl<1> with the low level and the third address ADD<2> with the low level are inputted. The second decoding block 210-1 enables the second-third word line WL_B<2> among the second word lines WL_B<0>, WL_B<1>, WL_B<2> and WL_B<3> when the second address ADD<1> is at the low level in the example where the first decoding control signal D_ctrl<0> with the low level, the second decoding control signal D_ctrl<1> with the high level and the third address ADD<2> with the low level are inputted. The second decoding block 210-1 enables the second-fourth word line WL_B<3> among the second word lines WL_B<0>, WL_B<1>, WL_B<2> and WL_B<3> when the second address ADD<1> is at the high level in the example where the first decoding control signal D_ctrl<0> with the low level, the second decoding control signal D_ctrl<1> with the high level and the third address ADD<2> with the low level are inputted. The second decoding block 210-1 simultaneously enables the second-first word line WL_B<0> and the second-third word line WL_B<2> when the second address ADD<1> is at the low level in the example where the first and second decoding control signals D_ctrl<0> and D_ctrl<1> with the high level are inputted and the third address ADD<2> with the low level is inputted. The second decoding block 210-1 simultaneously enables the second-second word line WL_B<1> and the second-fourth word line WL_B<3> when the second address ADD<1> is at the high level in the example where the first and second decoding control signals D_ctrl<0> and D_ctrl<1> with the high level are inputted and the third address ADD<2> with the low level is inputted.

The second decoding block 210-1 may include nineteenth to twenty-fifth inverters IV19 to IV25. The second decoding block 210-1 may include ninth to twelfth NAND gates ND9 to ND12. The nineteenth inverter IV19 receives the third address ADD<2>. The twentieth inverter IV20 receives the second address ADD<1>. The twenty-first inverter IV21 receives the second address ADD<1>. The ninth NAND gate ND9 receives the first decoding control signal D_ctrl<0>, the output signal of the nineteenth inverter IV19, and the output signal of the twentieth inverter IV20. The tenth NAND gate ND10 receives the first decoding control signal D_ctrl<0>, the second address ADD<1>, and the output signal of the nineteenth inverter IV19. The eleventh NAND gate ND11 receives the second decoding control signal D_ctrl<1>, the output signal of the nineteenth inverter IV19, and the output signal of the twenty-first inverter IV21. The twelfth NAND gate ND12 receives the second decoding control signal D_ctrl<1>, the second address ADD<1>, and the output signal of the nineteenth inverter IV19. The twenty-second inverter IV22 receives the output signal of the ninth NAND gate ND9, and enables the second-first word line WL_B<0>. The twenty-third inverter IV23 receives the output signal of the tenth NAND gate ND10, and enables the second-second word line WL_B<1>. The twenty-fourth inverter IV24 receives the output signal of the eleventh NAND gate ND11, and enables the second-third word line WL_B<2>. The twenty-fifth inverter IV25 receives the output signal of the twelfth NAND gate ND12, and enables the second-fourth word line WL_B<3>.

The first word lines WL_A<0>, WL_A<1>, WL_A<2> and WL_A<3> and the second word lines WL_B<0>, WL_B<1>, WL_B<2> and WL_B<3> may be electrically coupled to different data storage regions.

Operations of the semiconductor memory apparatus in accordance with the embodiments, configured as mentioned above, will be described below.

Descriptions will be made for operations in which the double enable signal Double_en is disabled and one word line among the four first word lines WL_A<0>, WL_A<1>, WL_A<2> and WL_A<3> and the four second word lines WL_B<0>, WL_B<1>, WL_B<2> and WL_B<3> is enabled.

The decoding control block 100-1 generates the first and second decoding control signals D_ctrl<0> and D_ctrl<1> with different levels in response to the first address ADD<0> when the double enable signal Double_en is disabled. For example, the decoding control block 100-1 outputs the first decoding control signal D_ctrl<0> with the high level and outputs the second decoding control signal D_ctrl<1> with the low level, when the double enable signal Double_en is disabled to a low level and the first address ADD<0> is at the low level. The decoding control block 100-1 outputs the first decoding control signal D_ctrl<0> with the low level and outputs the second decoding control signal D_ctrl<1> with the high level, when the double enable signal Double_en is disabled to the low level and the first address ADD<0> is at the high level.

The first and second decoding blocks 200-1 and 210-1 enable one of the first word lines WL_A<0>, WL_A<1>, WL_A<2> and WL_A<3> and the second word lines WL_B<0>, WL_B<1>, WL_B<2> and WL_B<3> in response to the second and third addresses ADD<1> and ADD<2> when the first and second decoding control signals D_ctrl<0> and D_ctrl<1> have different levels. For example, the first decoding block 200-1 enables the first-first word line WL_A<0> when the second address ADD<1> is at the low level and the third address ADD<2> is at the high level in the example where the first decoding control signal D_ctrl<0> is at the high level and the second decoding control signal D_ctrl<1> is at the low level. The first decoding block 200-1 enables the first-second word line WL_A<1> when the second address ADD<1> is at the high level and the third address ADD<2> is at the high level in the example where the first decoding control signal D_ctrl<0> is at the high level and the second decoding control signal D_ctrl<1> is at the low level. The first decoding block 200-1 enables the first-third word line WL_A<2> when the second address ADD<1> is at the low level and the third address ADD<2> is at the high level in the example where the first decoding control signal D_ctrl<0> is at the low level and the second decoding control signal D_ctrl<1> is at the high level. The first decoding block 200-1 enables the first-fourth word line WL_A<3> when the second address ADD<1> is at the high level and the third address ADD<2> is at the high level in the example where the first decoding control signal D_ctrl<0> is at the low level and the second decoding control signal D_ctrl<1> is at the high level. The second decoding block 210-1 enables the second-first word line WL_B<0> when the second address ADD<1> is at the low level and the third address ADD<2> is at the low level in the example where the first decoding control signal D_ctrl<0> is at the high level and the second decoding control signal D_ctrl<1> is at the low level. The second decoding block 210-1 enables the second-second word line WL_B<1> when the second address ADD<1> is at the high level and the third address ADD<2> is at the low level in the example where the first decoding control signal D_ctrl<0> is at the high level and the second decoding control signal D_ctrl<1> is at the low level. The second decoding block 210-1 enables the second-third word line WL_B<2> when the second address ADD<1> is at the low level and the third address ADD<2> is at the low level in the example where the first decoding control signal D_ctrl<0> is at the low level and the second decoding control signal D_ctrl<1> is at the high level. The second decoding block 210-1 enables the second-fourth word line WL_B<3> when the second address ADD<1> is at the high level and the third address ADD<2> is at the low level in the example where the first decoding control signal D_ctrl<0> is at the low level and the second decoding control signal D_ctrl<1> is at the high level.

For example, the semiconductor memory apparatus in accordance with the embodiments perform the operation of enabling one word line among a plurality of word lines (the first word lines WL_A<0:3> and the second word lines WL_B<0:3>) electrically coupled to different data storage regions when the double enable signal Double_en is disabled.

Descriptions will be made for operations in which the double enable signal Double_en is enabled and two word lines among the four first word lines WL_A<0>, WL_A<1>, WL_A<2> and WL_A<3> and the four second word lines WL_B<0>, WL_B<1>, WL_B<2> and WL_B<3> are simultaneously enabled.

The decoding control block 100-1 outputs the first and second decoding control signals D_ctrl<0> and D_ctrl<1> as signals with the same level when the double enable signal Double_en is enabled. For example, the decoding control block 100-1 outputs the first and second decoding control signals D_ctrl<0> and D_ctrl<1> as signals with the high level regardless of the first address ADD<0> when the double enable signal Double_en is enabled to a high level.

The first decoding block 200-1 simultaneously enables the first-first and first-third word lines WL_A<0> and WL_A<2> when the second address ADD<1> is at the low level in the example where both the first and second decoding control signals D_ctrl<0> and D_ctrl<1> are at the high level and the third address ADD<2> is at the high level. The first decoding block 200-1 simultaneously enables the first-second and first-fourth word lines WL_A<1> and WL_A<3> when the second address ADD<1> is at the high level in the example where both the first and second decoding control signals D_ctrl<0> and D_ctrl<1> are at the high level and the third address ADD<2> is at the high level. for example, the second decoding block 210-1 simultaneously enables the second-first and second-third word lines WL_B<0> and WL_B<2> when the second address ADD<1> is at the low level in the example where both the first and second decoding control signals D_ctrl<0> and D_ctrl<1> are at the high level and the third address ADD<2> is at the low level. The second decoding block 210-1 simultaneously enables the second-second and second-fourth word lines WL_B<1> and WL_B<3> when the second address ADD<1> is at the high level in the example where both the first and second decoding control signals D_ctrl<0> and D_ctrl<1> are at the high level and the third address ADD<2> is at the low level.

As a result, the semiconductor memory apparatus in accordance with the embodiments simultaneously enables two word lines among the plurality of word lines WL_A<0:3> and WL_B<0:3> electrically coupled to different data storage regions, in response to addresses, when the double enable signal Double_en is enabled.

The semiconductor memory apparatus in accordance with the embodiments enables one word line among the plurality of word lines WL_A<0:3> and WL_B<0:3> electrically coupled to different data storage regions, in response to addresses, when the double enable signal Double_en is disabled.

That is to say, if the double enable signal Double_en is disabled and one word line and one bit line are selected, one memory cell is selected, and data is stored in the selected memory cell or the data stored in the selected memory cell is outputted.

The semiconductor memory apparatus in accordance with the embodiments simultaneously enables two word lines among the plurality of word lines WL_A<0:3> and WL_B<0:3> electrically coupled to different data storage regions, in response to addresses, when the double enable signal Double_en is enabled.

That is to say, if the double enable signal Double_en is enabled, two word lines are simultaneously selected and one bit line is selected, two memory cells are simultaneously selected. The same data are stored in the two memory cells which are simultaneously selected, and the same data are outputted from the two memory cells in which the same data are stored.

When the semiconductor memory apparatus in accordance with the embodiments is used for the high reliability of data, a double enable signal is enabled, and the same data are simultaneously stored in a plurality of memory cells, whereby the reliability of data may be improved. When the semiconductor memory apparatus in accordance with the embodiments is used for large data storage capacity, the double enable signal is disabled, data are stored in individual memory cells, whereby large data storage capacity may be secured.

Figure 3:
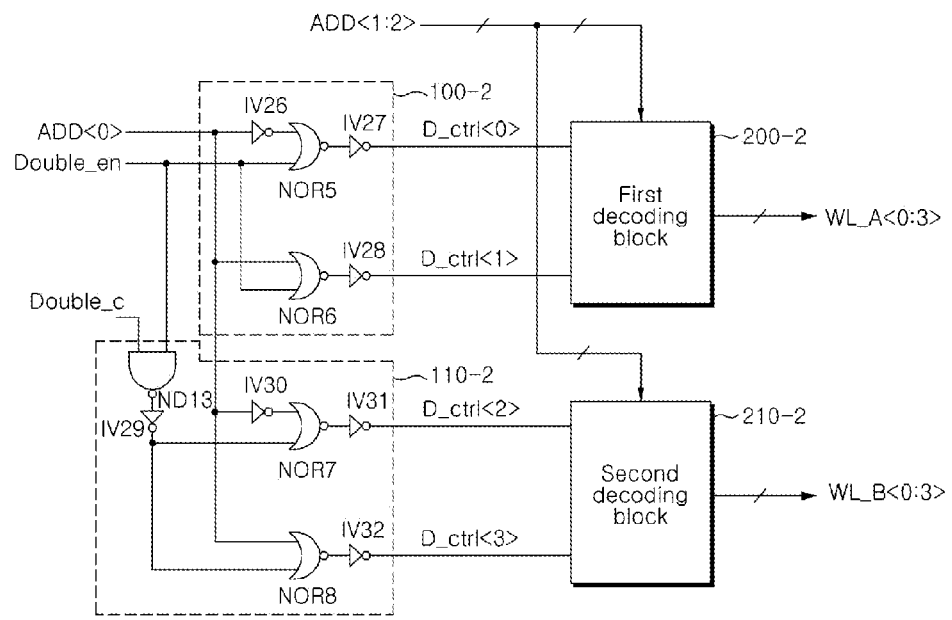
FIG. 3 is a configuration diagram illustrating a representation of an example of a semiconductor memory apparatus in accordance with an embodiment.

Referring to FIG. 3, a semiconductor memory apparatus in accordance with an embodiment may include first and second decoding control blocks 100-2 and 110-2, and first and second decoding blocks 200-2 and 210-2.

The first decoding control block 100-2 generates a first decoding control signal D_ctrl<0> and a second decoding control signal D_ctrl<1>. The first decoding control block 100-2 generates a first decoding control signal D_ctrl<0> and a second decoding control signal D_ctrl<1> in response to an address specified among first to third addresses ADD<0:2>, for example, the first address ADD<0>, and a double enable signal Double_en. For example, the first decoding control block 100-2 generates the first and second decoding control signals D_ctrl<0> and D_ctrl<1> with different levels in response to the first address ADD<0> when the double enable signal Double_en is disabled. The first decoding control block 100-2 outputs the first and second decoding control signals D_ctrl<0> and D_ctrl<1> with the same level regardless of the first address ADD<0> when the double enable signal Double_en is enabled. For example, the first decoding control block 100-2 generates the first decoding control signal D_ctrl<0> with a high level and the second decoding control signal D_ctrl<1> with a low level when the double enable signal Double_en is disabled and the first address ADD<0> is a low level. The first decoding control block 100-2 generates the first decoding control signal D_ctrl<0> with a low level and the second decoding control signal D_ctrl<1> with a high level when the double enable signal Double_en is disabled and the first address ADD<0> is a high level. The first decoding control block 100-2 generates the first and second decoding control signals D_ctrl<0> and D_ctrl<1> with the high level regardless of the first address ADD<0> when the double enable signal Double_en is enabled.

The first decoding control block 100-2 may include twenty-sixth to twenty-eighth inverters IV26, IV27 and IV28. The first decoding control block 100-2 may include fifth and sixth NOR gates NOR5 and NOR6. The twenty-sixth inverter IV26 receives the first address ADD<0>. The fifth NOR gate NOR5 receives the output signal of the twenty-sixth inverter IV26 and the double enable signal Double_en. The sixth NOR gate NOR6 receives the first address ADD<0> and the double enable signal Double_en. The twenty-seventh inverter IV27 receives the output signal of the fifth NOR gate NOR5, and outputs the first decoding control signal D_ctrl<0>. The twenty-eighth inverter IV28 receives the output signal of the sixth NOR gate NOR6, and outputs the second decoding control signal D_ctrl<1>.

The second decoding control block 110-2 generates a third decoding control signal D_ctrl<2> and a fourth decoding control signal D_ctrl<3>. The second decoding control block 110-2 generates a third decoding control signal D_ctrl<2> and a fourth decoding control signal D_ctrl<3> in response to the double enable signal Double_en, a double control signal Double_c and the first address ADD<0>. For example, the second decoding control block 110-2 generates the third and fourth decoding control signals D_ctrl<2> and D_ctrl<3> with different levels in response to the first address ADD<0> when even one of the double enable signal Double_en and the double control signal Double_c is disabled. The second decoding control block 110-2 generates the third and fourth decoding control signals D_ctrl<2> and D_ctrl<3> with the same level regardless of the first address ADD<0> when both the double enable signal Double_en and the double control signal Double_c are enabled. For example, the second decoding control block 110-2 generates the third decoding control signal D_ctrl<2> with a high level and the fourth decoding control signal D_ctrl<3> with a low level when the first address ADD<0> is at the low level in the example where even one of the double enable signal Double_en and the double control signal Double_c is disabled. The second decoding control block 110-2 generates the third decoding control signal D_ctrl<2> with a low level and the fourth decoding control signal D_ctrl<3> with a high level when the first address ADD<0> is at the high level in the example where even one of the double enable signal Double_en and the double control signal Double_c is disabled. The second decoding control block 110-2 generates the third and fourth decoding control signals D_ctrl<2> and D_ctrl<3> with the high level regardless of the first address ADD<0> when both the double enable signal Double_en and the double control signal Double_c are enabled.

The second decoding control block 110-2 may include twenty-ninth to thirty-second inverters IV29, IV30, IV31 and IV32. The second decoding control block 110-2 may include seventh and eighth NOR gates NOR7 and NOR8. The second decoding control block 110-2 may include a thirteenth NAND gate ND13. The thirteenth NAND gate ND13 receives the double enable signal Double_en and the double control signal Double_c. The twenty-ninth inverter IV29 receives the output signal of the thirteenth NAND gate ND13. The thirtieth inverter IV30 receives the first address ADD<0>. The seventh NOR gate NOR7 receives the output signal of the twenty-ninth inverter IV29 and the output signal of the thirtieth inverter IV30. The eighth NOR gate NOR8 receives the first address ADD<0> and the output signal of the twenty-ninth inverter IV29. The thirty-first inverter IV31 receives the output signal of the seventh NOR gate NOR7, and outputs the third decoding control signal D_ctrl<2>. The thirty-second inverter IV32 receives the output signal of the eighth NOR gate NOR8, and outputs the fourth decoding control signal D_ctrl<3>.

The first decoding block 200-2 may enable one word line or may simultaneously enable two word lines among four first word lines WL_A<0:3> in response to the first and second decoding control signals D_ctrl<0> and D_ctrl<1> and the second and third addresses ADD<1> and ADD<2>. For example, the first decoding block 200-2 enables one word line among the first word lines WL_A<0:3> in response to the second and third addresses ADD<1:2> when the first and second decoding control signals D_ctrl<0> and D_ctrl<1> with different levels are inputted. The first decoding block 200-2 simultaneously enables two word lines among the first word lines WL_A<0:3> in response to the second and third addresses ADD<1:2> when the first and second decoding control signals D_ctrl<0> and D_ctrl<1> with the same level are inputted. For example, the first decoding block 200-2 enables one of the first-first word line WL_A<0> and the first-third word line WL_A<2> in response to the second address ADD<1> when the first decoding control signal D_ctrl<0> with the high level, the second decoding control signal D_ctrl<1> with the low level and the third address ADD<2> with a high level are inputted. The first decoding block 200-2 enables one of the first-second word line WL_A<1> and the first-fourth word line WL_A<3> in response to the second address ADD<1> when the first decoding control signal D_ctrl<0> with the low level, the second decoding control signal D_ctrl<1> with the high level and the third address ADD<2> with the high level are inputted. The first decoding block 200-2 simultaneously enables the first-first word line WL_A<0> and the first-third word line WL_A<2> or the first-second word line WL_A<1> and the first-fourth word line WL_A<3> in response to the second address ADD<1> when the first and second decoding control signals D_ctrl<0> and D_ctrl<1> with the high level are inputted and the third address ADD<2> with the high level is inputted.

The first decoding block 200-2 may be configured in substantially the same manner as the first decoding block 200-1 illustrated in FIG. 2.

The second decoding block 210-2 may enable one word line or may simultaneously enable two word lines among four second word lines WL_B<0:3> in response to the third and fourth decoding control signals D_ctrl<2> and D_ctrl<3> and the second and third addresses ADD<1> and ADD<2>. For example, the second decoding block 210-2 enables one word line among the second word lines WL_B<0:3> in response to the second and third addresses ADD<1:2> when the third and fourth decoding control signals D_ctrl<2> and D_ctrl<3> with different levels are inputted. The second decoding block 210-2 simultaneously enables two word lines among the second word lines WL_B<0:3> in response to the second and third addresses ADD<1:2> when the third and fourth decoding control signals D_ctrl<2> and D_ctrl<3> with the same level are inputted. For example, the second decoding block 210-2 enables one of the second-first word line WL_B<0> and the second-third word line WL_B<2> in response to the second address ADD<1> when the third decoding control signal D_ctrl<2> with the high level, the fourth decoding control signal D_ctrl<3> with the low level and the third address ADD<2> with a low level are inputted. The second decoding block 210-2 enables one of the second-second word line WL_B<1> and the second-fourth word line WL_B<3> in response to the second address ADD<1> when the third decoding control signal D_ctrl<2> with the low level, the fourth decoding control signal D_ctrl<3> with the high level and the third address ADD<2> with the low level are inputted. The second decoding block 210-2 simultaneously enables the second-first word line WL_B<0> and the second-third word line WL_B<2> or the second-second word line WL_B<1> and the second-fourth word line WL_B<3> in response to the second address ADD<1> when the third and fourth decoding control signals D_ctrl<2> and D_ctrl<3> with the high level are inputted and the third address ADD<2> with the low level is inputted.

The second decoding block 210-2 may be configured in substantially the same manner as the second decoding block 210-1 illustrated in FIG. 2, with the exception that the signals inputted thereto are different.

Operations of the semiconductor memory apparatus in accordance with the embodiments, configured as mentioned above, will be described below.

If the double enable signal Double_en is disabled, the first decoding control block 100-2 outputs the first and second decoding control signals D_ctrl<0> and D_ctrl<1> with different levels in response to the first address ADD<0>.

If the double enable signal Double_en is disabled, the second decoding control block 110-2 outputs the third and fourth decoding control signals D_ctrl<2> and D_ctrl<3> with different levels in response to the first address ADD<0>.

If the first and second decoding control signals D_ctrl<0> and D_ctrl<1> with different levels are inputted to the first decoding block 200-2, the first decoding block 200-2 enables one word line among the first word lines WL_A<0:3> in response to the second and third addresses ADD<1:2>.

If the third and fourth decoding control signals D_ctrl<2> and D_ctrl<3> with different levels are inputted to the second decoding block 210-2, the second decoding block 210-2 enables one word line among the second word lines WL_B<0:3> in response to the second and third addresses ADD<1:2>.

The semiconductor memory apparatus in accordance with the embodiments enables one word line among the first word lines WL_A<0:3> and the second word lines WL_B<0:3> in response to the first to third addresses ADD<0:2> when the double enable signal Double_en is disabled.

If the double enable signal Double_en is enabled and the double control signal Double_c is disabled, the first decoding control block 100-2 generates the first and second decoding control signals D_ctrl<0> and D_ctrl<1> with the same level, and the second decoding control block 110-2 generates the third and fourth decoding control signals D_ctrl<2> and D_ctrl<3> with different levels.

The first decoding block 200-2, which receives the first and second decoding control signals D_ctrl<0> and D_ctrl<1> with the same level, simultaneously enables two word lines among the first word lines WL_A<0:3> in response to the second and third addresses ADD<1:2>.

The second decoding block 210-2, which receives the third and fourth decoding control signals D_ctrl<2> and D_ctrl<3> with different levels, enables one word line among the second word lines WL_B<0:3> in response to the second and third addresses ADD<1:2>. The first word lines WL_A<0:3> and the second word lines WL_B<0:3> are electrically coupled with different data storage regions.

The semiconductor memory apparatus in accordance with the embodiments simultaneously enables two word lines in one data storage region and enables one word line in the other data storage region, in response to the first to third addresses ADD<0:2> when the double enable signal Double_en is enabled and the double control signal Double_c is disabled.

If both the double enable signal Double_en and the double control signal Double_c are enabled, the first and second decoding control blocks 100-2 and 110-2 output all the first to fourth decoding control signals D_ctrl<0>, D_ctrl<1>, D_ctrl<2> and D_ctrl<3> as signals with the high level regardless of the first address ADD<0>.

If the first and second decoding control signals D_ctrl<0> and D_ctrl<1> with the same level are inputted to the first decoding block 200-2, the first decoding block 200-2 simultaneously enables two word lines among the first word lines WL_A<0:3> in response to the second and third addresses ADD<1:2>.

If the third and fourth decoding control signals D_ctrl<2> and D_ctrl<3> with the same level are inputted to the second decoding block 210-2, the second decoding block 210-2 simultaneously enables two word lines among the second word lines WL_B<0:3> in response to the second and third addresses ADD<1:2>.

The semiconductor memory apparatus in accordance with the embodiments simultaneously enables two word lines among the word lines electrically coupled with different data storage regions in response to the first to third addresses ADD<0:2> when both the double enable signal Double_en and the double control signal Double_c are enabled.

The semiconductor memory apparatus in accordance with the embodiments may simultaneously enable two word lines in a data storage region desired among a plurality of data storage regions, and may enable one word line in the other data storage regions. The semiconductor memory apparatus in accordance with the embodiments may enable word lines one by one in all data storage regions, or may simultaneously enable two word lines in all data storage regions. The semiconductor memory apparatus in accordance with the embodiments may store one data in each memory cell of a data storage region or store one data in two memory cells, according to a use. The semiconductor memory apparatus in accordance with the embodiments may store one data in two memory cells in one data storage region and store one data in each memory cell in the other data storage region, according to the importance of data.

Figure 5:
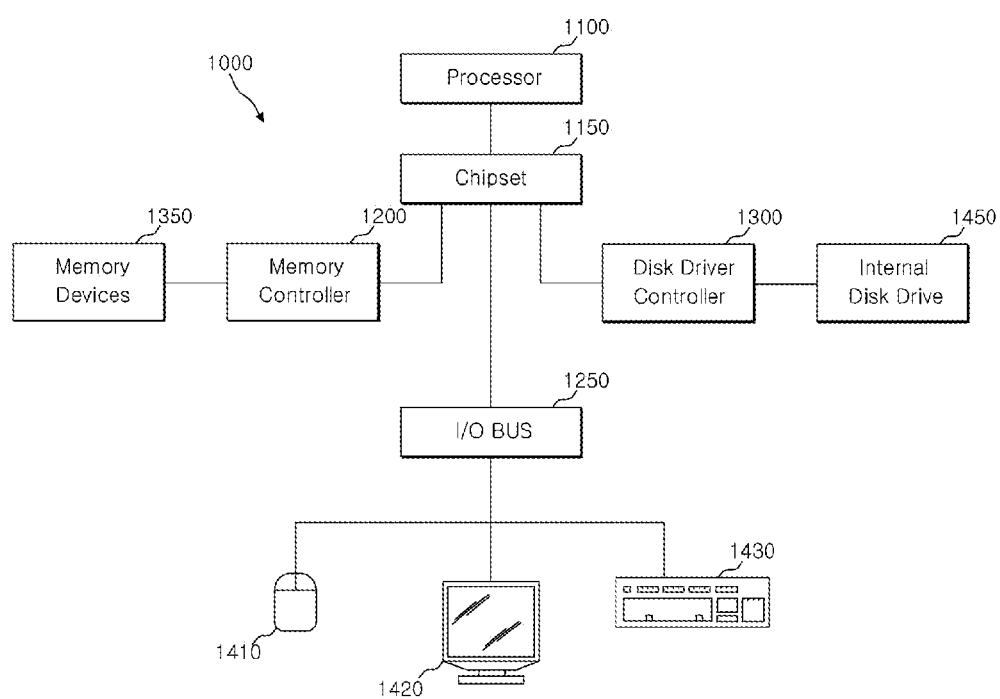
FIG. 5 illustrates a block diagram of an example of a representation of a system employing the semiconductor memory apparatus in accordance with the embodiments discussed above with relation to FIGS. 1-4.

The semiconductor memory apparatus discussed above (see FIGS. 1-4) are particular useful in the design of memory devices, processors, and computer systems. For example, referring to FIG. 5, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor memory apparatus as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor memory apparatus described herein should not be limited based on the described embodiments.

What is claimed is:

1. A semiconductor memory apparatus comprising:
   a decoding control block configured to generate a first decoding control signal and a second decoding control signal in response to a double enable signal and a first address; and
   a decoding block configured to enable only one word line among a plurality of word lines or simultaneously enable at least two word lines among the plurality of word lines, in response to the first and second decoding control signals and a second address.

2. The semiconductor memory apparatus according to claim 1, wherein the double enable signal is a signal outputted from a register for setting operations of the semiconductor memory apparatus.

3. The semiconductor memory apparatus according to claim 1,
   wherein the decoding control block outputs the first and second decoding control signals as signals with different levels, in response to the first address when the double enable signal is disabled, and
   wherein the decoding control block outputs the first and second decoding control signals as signals with the same level, regardless of the first address when the double enable signal is enabled.

4. The semiconductor memory apparatus according to claim 1,
   wherein the decoding block enables one word line among the plurality of word lines in response to the second address when the first and second decoding control signals with different levels are inputted, and
   wherein the decoding block simultaneously enables at least two word lines among the plurality of word lines in response to the second address when the first and second decoding control signals with the same level are inputted.

5. A semiconductor memory apparatus comprising:
   a decoding control block configured to generate a first decoding control signal and a second decoding control signal in response to a specified address among a plurality of addresses and a double enable signal;
   a first decoding block configured to enable one word line or simultaneously enable two word lines among a plurality of first word lines, in response to addresses remaining by excluding the specified address among the plurality of addresses and the first and second decoding control signals; and
   a second decoding block configured to enable one word line or simultaneously enable two word lines among a plurality of second word lines, in response to the addresses remaining by excluding the specified address among the plurality of addresses and the first and second decoding control signals.

6. The semiconductor memory apparatus according to claim 5, wherein the plurality of first word lines and the plurality of second word lines are electrically coupled with different data storage regions, respectively.

7. The semiconductor memory apparatus according to claim 6,
   wherein the decoding control block outputs the first and second decoding control signals as signals with different levels, in response to the specified address when the double enable signal is disabled, and
   wherein the decoding control block outputs the first and second decoding control signals as signals with the same level, regardless of the specified address when the double enable signal is enabled.

8. The semiconductor memory apparatus according to claim 7,
   wherein the first decoding block enables one word line among the plurality of first word lines in response to the addresses remaining by excluding the specified address among the plurality of addresses when the first and second decoding control signals with different levels are inputted, and wherein the first decoding block simultaneously enables at least two word lines among the plurality of first word lines in response to the addresses remaining by excluding the specified address among the plurality of addresses when the first and second decoding control signals with the same level are inputted.

9. The semiconductor memory apparatus according to claim 7,
wherein the second decoding block enables one word line among the plurality of second word lines in response to the addresses remaining by excluding the specified address among the plurality of addresses when the first and second decoding control signals with different levels are inputted, and
wherein the second decoding block simultaneously enables at least two word lines among the plurality of second word lines in response to the addresses remaining by excluding the specified address among the plurality of addresses when the first and second decoding control signals with the same level are inputted.

10. A semiconductor memory apparatus comprising:
a first decoding control block configured to generate a first decoding control signal and a second decoding control signal in response to a specified address among a plurality of addresses and a double enable signal;
a second decoding control block configured to generate a third decoding control signal and a fourth decoding control signal in response to the specified address, the double enable signal and a double control signal;
a first decoding block configured to enable one word line or simultaneously enable two word lines among a plurality of first word lines, in response to addresses remaining by excluding the specified address among the plurality of addresses and the first and second decoding control signals; and
a second decoding block configured to enable one word line or simultaneously enable two word lines among a plurality of second word lines, in response to the addresses remaining by excluding the specified address among the plurality of addresses and the third and fourth decoding control signals.

11. The semiconductor memory apparatus according to claim 10,
wherein the first decoding control block outputs the first and second decoding control signals as signals with different levels, in response to the specified address when the double enable signal is disabled, and
wherein the first decoding control block outputs the first and second decoding control signals as signals with the same level, regardless of the specified address when the double enable signal is enabled.

12. The semiconductor memory apparatus according to claim 11,
wherein the first decoding block enables one word line among the plurality of first word lines in response to the addresses remaining by excluding the specified address among the plurality of addresses when the first and second decoding control signals with different levels are inputted, and
wherein the first decoding block simultaneously enables at least two word lines among the plurality of first word lines in response to the addresses remaining by excluding the specified address among the plurality of addresses when the first and second decoding control signals with the same level are inputted.

13. The semiconductor memory apparatus according to claim 10,
wherein the second decoding control block outputs the third and fourth decoding control signals as signals with different levels, in response to the specified address when even one of the double enable signal and the double control signal is disabled, and
wherein the second decoding control block outputs the third and fourth decoding control signals as signals with the same level, regardless of the specified address when both the double enable signal and the double control signal are enabled.

14. The semiconductor memory apparatus according to claim 13,
wherein the second decoding block enables one word line among the plurality of second word lines in response to the addresses remaining by excluding the specified address among the plurality of addresses when the third and fourth decoding control signals with different levels are inputted, and
wherein the second decoding block simultaneously enables at least two word lines among the plurality of second word lines in response to the addresses remaining by excluding the specified address among the plurality of addresses when the third and fourth decoding control signals with the same level are inputted.

15. A semiconductor memory apparatus comprising:
a first data storage region electrically coupled with a plurality of first word lines; and
a second data storage region electrically coupled with a plurality of second word lines,
wherein, in response to a double enable signal, a double control signal and a plurality of addresses, two word lines among the plurality of first word lines are simultaneously enabled and one word line among the plurality of second word lines is enabled, or two word lines among the plurality of first word lines are simultaneously enabled and two word lines among the plurality of second word lines are simultaneously enabled.

16. The semiconductor memory apparatus according to claim 15, further comprising:
a first decoding control block configured to generate a first decoding control signal and a second decoding control signal in response to the double enable signal and a specified address among the plurality of addresses;
a second decoding control block configured to generate a third decoding control signal and a fourth decoding control signal in response to the double enable signal, the double control signal and the specified address;
a first decoding block configured to enable one word line or simultaneously enable two word lines among the plurality of first word lines, in response to the first and second decoding control signals and addresses remaining by excluding the specified address among the plurality of addresses; and
a second decoding block configured to enable one word line or simultaneously enable two word lines among the plurality of second word lines, in response to the third and fourth decoding control signals and the addresses remaining by excluding the specified address among the plurality of addresses.

17. The semiconductor memory apparatus according to claim 16, wherein the first decoding control block outputs the first and second decoding control signals as signals with different levels or signals with the same level, in response to the double enable signal and the specified address.

18. The semiconductor memory apparatus according to claim 16, wherein the second decoding control block outputs the third and fourth decoding control signals as signals with different levels or signals with the same level, in response to the double enable signal, the double control signal and the specified address.

19. The semiconductor memory apparatus according to claim 16,
- wherein each of the first and second decoding blocks enables one word line in response to the addresses remaining by excluding the specified address among the plurality of addresses, when decoding control signals inputted thereto have different levels, and
- wherein each of the first and second decoding blocks simultaneously enables two word lines in response to the addresses remaining by excluding the specified address among the plurality of addresses, when decoding control signals inputted thereto have the same level.

20. A semiconductor memory apparatus comprising:
- a first memory cell coupled to a first word line and a bit line; and
- a second memory cell coupled to a second word line and the bit line,
- wherein the semiconductor memory apparatus is configured to store data in only the first memory cell in response to a first address, second address, and double enable signal, or to store the data in both the first and second memory cells in response to the first address, second address, and the double enable signal.

21. The semiconductor memory apparatus according to claim 20, wherein when the double enable signal is enabled the data is stored in both the first and second memory cells and when the double enable signal is disabled the data is stored in only the first memory cell.

* * * * *